(12) United States Patent
Gektin et al.

(10) Patent No.: US 6,945,315 B1
(45) Date of Patent: Sep. 20, 2005

(54) HEATSINK WITH ACTIVE LIQUID BASE

(75) Inventors: Vadim Gektin, San Jose, CA (US); Shlomo Novotny, Wayland, MA (US); Marlin R. Vogel, Brentwood, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/703,282

(22) Filed: Oct. 31, 2000

(51) Int. Cl.[7] .............................. F28F 7/00; F28D 15/00
(52) U.S. Cl. .............................. 165/80.4; 165/104.33; 165/104.31
(58) Field of Search .................. 165/80.4, 121, 165/122, 125, 104.25, 104.33, 104.28, 104.31; 361/699, 698; 257/714

(56) References Cited

U.S. PATENT DOCUMENTS

| | | | | |
|---|---|---|---|---|
| 4,098,279 A | * | 7/1978 | Golden .......................... 607/104 |
| 4,183,400 A | * | 1/1980 | Seifert ........................... 165/104.29 |
| 4,252,185 A | * | 2/1981 | Kosson ........................... 165/104.25 |
| 5,309,318 A | * | 5/1994 | Beilstein, Jr. et al. ........ 361/699 |
| 5,316,077 A | * | 5/1994 | Reichard ....................... 361/699 |
| 5,731,954 A | * | 3/1998 | Cheon ........................... 361/699 |
| 5,763,951 A | * | 6/1998 | Hamilton et al. ............. 257/714 |
| 5,787,971 A | * | 8/1998 | Dodson .......................... 165/121 |
| 6,019,165 A | * | 2/2000 | Batchelder .................... 165/80.4 |
| 6,175,495 B1 | * | 1/2001 | Batchelder .................... 361/695 |
| 6,257,320 B1 | * | 7/2001 | Wargo ........................... 165/80.4 |
| 6,302,192 B1 | * | 10/2001 | Dussinger et al. ............ 165/104.26 |
| 6,324,058 B1 | * | 11/2001 | Hsiao ............................. 361/699 |

* cited by examiner

Primary Examiner—Tho V Duong
(74) Attorney, Agent, or Firm—Martine Penilla & Gencarella, LLP

(57) ABSTRACT

A device for the transfer of heat away from a heat source comprising a base having first and second surfaces a plurality of fins extending adjacent to the second surface of the base. The base further including a chamber disposed between the first surface and the second surface of the base. The chamber further including a divider disposed therein adjacent the first surface. A pump is also disposed within the chamber to circulate fluid within the chamber.

9 Claims, 4 Drawing Sheets

HEATSINK WITH ACTIVE LIQUID BASE

FIELD OF THE INVENTION

The present invention relates to heatsinks for integrated circuits, more specifically an improved heat sink for central processing units (CPUs).

Prior Art

One side-effect of integrated circuits is that during use, some of the energy that is consumed is expelled as heat. Thus, there became a requirement to cool the integrated circuit during use. The problem of excessive heat buildup within integrated circuits has been a design consideration with which designers have had to contend with as the chips which house the integrated circuits are made smaller.

Designers have attempted to address the problem in many different ways. In one embodiment, a fan may be installed in the enclosure where the circuits reside, thereby constantly circulating air within the enclosure and over the chips to remove the excessive heat through the use of convection. Although this method is effective and relatively inexpensive to implement there are shortcomings associated with it. One of these shortcomings is that the enclosure must be designed to maximize air flow over and around the integrated circuits, many times this cannot be done due to design constraints or the ever pressing desire to make products smaller. An additional problem with the use of a fan to introduce air into the enclosure is the increased potential for contamination from the environment. For example, by constantly drawing air from the surroundings, dirt particles are drawn into the enclosure, thereby contaminating the environment. Further still, externally mounted fans contribute to noise pollution in the work environment.

Another limitation of providing a fan to cool the chip is that the fan must be energized with a power source, thereby requiring a greater amount of power for the overall system. An associated problem with the power draw is the generation of heat from the fan itself, thereby adding to the overall heat generation problem.

To address these problems finned heat sinks were provided by designers in an attempt to dissipate heat from the chip. Typically, these heatsinks are constructed having a base with a certain thickness and a plurality of "fins" extending from the base. In order to effectively cool the chip, the base and fins must be properly designed. For example, if the base is to thick then it will retain to much of the heat, thereby heating the chip beyond an ideal operating temperature. Alternatively, if the base is to thin, then it will not retain enough heat and will not efficiently conduct a sufficient amount of heat away from the chip. Along with these considerations special attention must be paid to the design of the fins. If the fins are to closely spaced, then the convection currents will be interrupted and heat will not be effectively carried away from the chip. If the fins are to far apart then there will be to little surface area to conduct a sufficient amount of heat away from the chip.

On top of these design problems, the designer must chose the proper material to construct the heatsink of. The most ideal material to construct a heatsink is copper due to copper's favorable thermodynamic properties. Typically copper cannot be utilized in heatsink construction because of the overall weight of the finished heatsink being to great, thereby placing undue stress on the chip. Therefore many times, the designer has to choose another material for the heatsink, typically aluminum is substituted for copper.

Another design constraint that the designers must be aware of is the size limitation that they may be facing. For example, in some applications there is very little space available around the chip, therefore the designer is not able to construct a heatsink with ideal dimensions, thus leading to another shortcoming of presently available designs.

To cope with the limited space, sometimes a designer will include a fan in combination with the heatsink. Although this combination may seem ideal, the addition of the fan brings along with it all of the shortcomings described above. Additionally, because a fan was added to the heatsink, a designer may not maximize the efficiency of the fin design because they are relying upon the fan to improve convection of a inefficient design. Thus, when the fan fails this may lead to overheating of the chip which ultimately could lead to chip failure.

An additional shortcoming of a traditional heatsink is that in use, heat is transferred from the chip to the base of the heatsink in a non-uniform pattern. That is, a chip generally will generate a greater amount of heat at its midpoint, thus a chip having a heatsink disposed thereon will transfer this heat to the midpoint of the base of the heatsink, thereby leaving the corners of the heatsink "cold". This leads to an inefficient use of the heatsink because only the center of the heatsink is conducting heat from the chip. Therefore, as the heat transfers through the base into the fins only the fins disposed around and adjacent to the midpoint of the heatsink are actually conveying heat from the chip. Thus, the fins and the base material disposed about the corners of the heatsink are not being utilized to conduct heat away from the chip.

An alternative design to those mentioned above is the use of a fluid-filled "chiller" system. This system is comprised of a plate having a fluid passage, at least two tubes connected to the plate, and an external refrigeration unit to cool the fluid. In use, the plate is fixedly attached to the chip, one fluid line is connected to the plate to supply fluid and a second fluid line is attached to the plate to carry away the heated fluid, the two fluid lines are coupled to the refrigeration unit. As the chip uses power, heat is produced, this heat is transferred to the plate affixed to the chip. As fluid flows through the plate the heat in the plate is conducted to the fluid. The fluid is then pumped to the refrigeration unit where the heat is removed from the fluid and the fluid is cooled to at least room temperature or preferably lower, therefore when the fluid enters the plate again the cycle is repeated.

A downside of fluid-filled systems such as those described above is that they occupy a considerable amount of space. In certain situations, space is not a consideration but for the home consumer or small business owner sometimes this can be a consideration. Also, systems such as those described above are very complex and costly. Sometimes systems such as these may cost more than the computer they are designed to be used for. Therefore they are not cost effective for home use or mass production. Also, because of the complexity of the system and the specialization of refrigeration unit requires someone with special knowledge to setup and maintain. A still further limitation of the present fluid filled cooling systems is the loss of fluid pressure within the system due to the amount of tubing that the cooling fluid must pass through.

Therefore there is a need to provide an improved heatsink that combines the efficiency of a fluid filled system but the simplicity of a aluminum heatsink.

BRIEF DESCRIPTION OF THE INVENTION

The present invention is an improved heatsink for cooling integrated circuits. The heatsink comprises a body constructed of aluminum or copper or any similar materials having good thermodynamic properties. The heatsink further includes a plurality of fins, a base, a pump, and a cooling fluid having advantageous thermodynamic properties. The base of the heatsink further includes at least one chamber to allow a fluid to flow therethrough.

In use the fluid is disposed within the chamber of the heatsink, thereby creating a sealed environment. A pump is disposed within the base and is in fluid communication with the plurality of passages within the chamber in the base. As the heat is conducted from the chip into the base of the heatsink, fluid passes over the base of the heatsink and the heat is transferred by convection into the fluid that is pumped over the base of the heatsink. The fluid is then pumped to a second passage disposed underneath the fins of the heatsink. Here the heat contained within the fluid is transferred to the fins through convection, whereby the fins transfer the heat to the surrounding atmosphere through convection.

The present invention improves upon the existing heatsink designs because the fluid and pump are contained within a single unit, therefore there is no need for complicated plumbing in order to use the present invention. Additionally, the heatsink of the present invention may be manufactured with hollow passages to allow fluid to flow therethrough. An added benefit of the hollow passages is the reduction of the overall weight of the heatsink, this reduction in weight allows the designer to utilize copper for the heatsink. Conventional heatsinks typically cannot be manufactured out of copper due to the overall weight of the heatsink. As still further benefit of the present invention is the reduction in mechanical noise. The noise reduction comes from not having an externally mounted fan as most heatsinks have.

DETAILED DESCRIPTION OF THE PRESENT INVENTION

Figure 1:
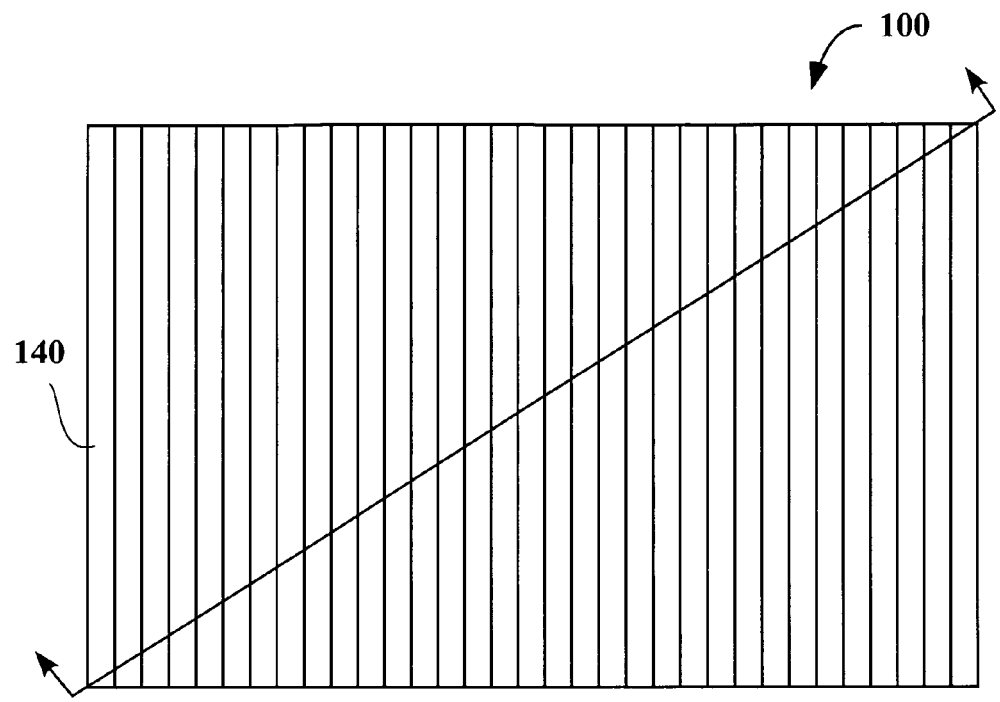
FIG. 1 Is a top view of the heatsink of the present invention.
Figure 2:
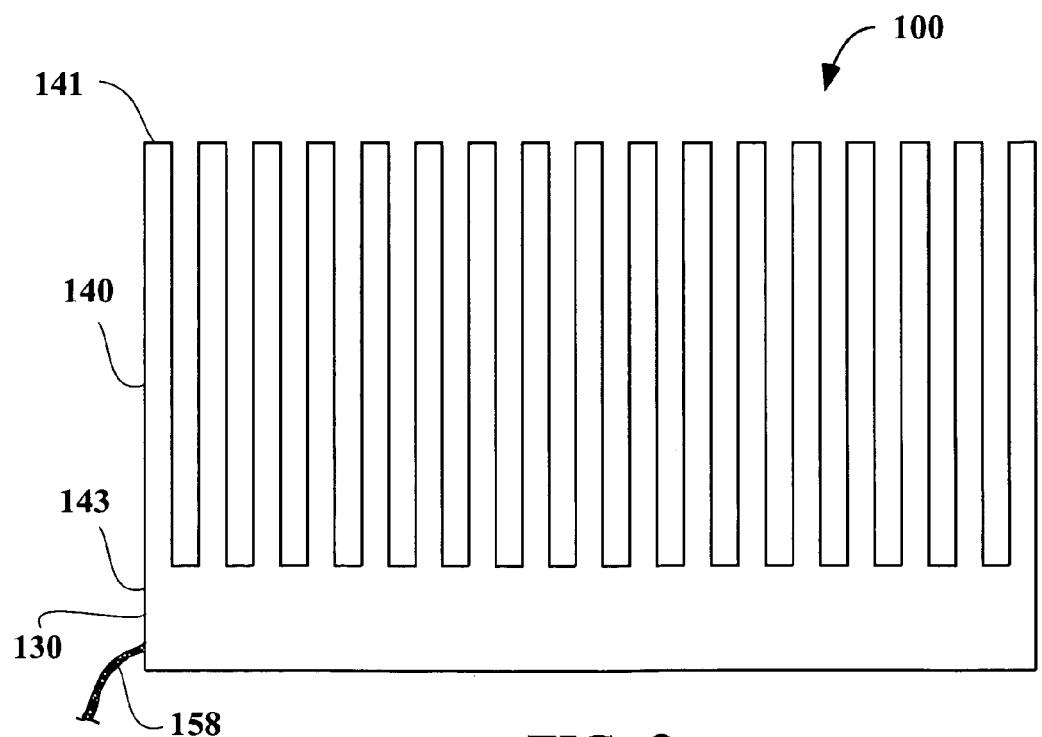
FIG. 2 is a side view of the heatsink of the present invention.

Referring now to FIGS. 1 and 2 there is shown a top view and a side view of heatsink 100. Heatsink 100 includes a plurality of fins 140 extending from base 130. Fins 140 further include first end 141 and second end 143. In one embodiment, first end 141 of fins 140 is fixedly attached to base 130. In a preferred embodiment, fins 140 are integrated with base 130. Heatsink 100 may be constructed of any material having good thermodynamic properties such as steel, stainless steel, aluminum, magnesium, copper or any other similar material.

Figure 3:
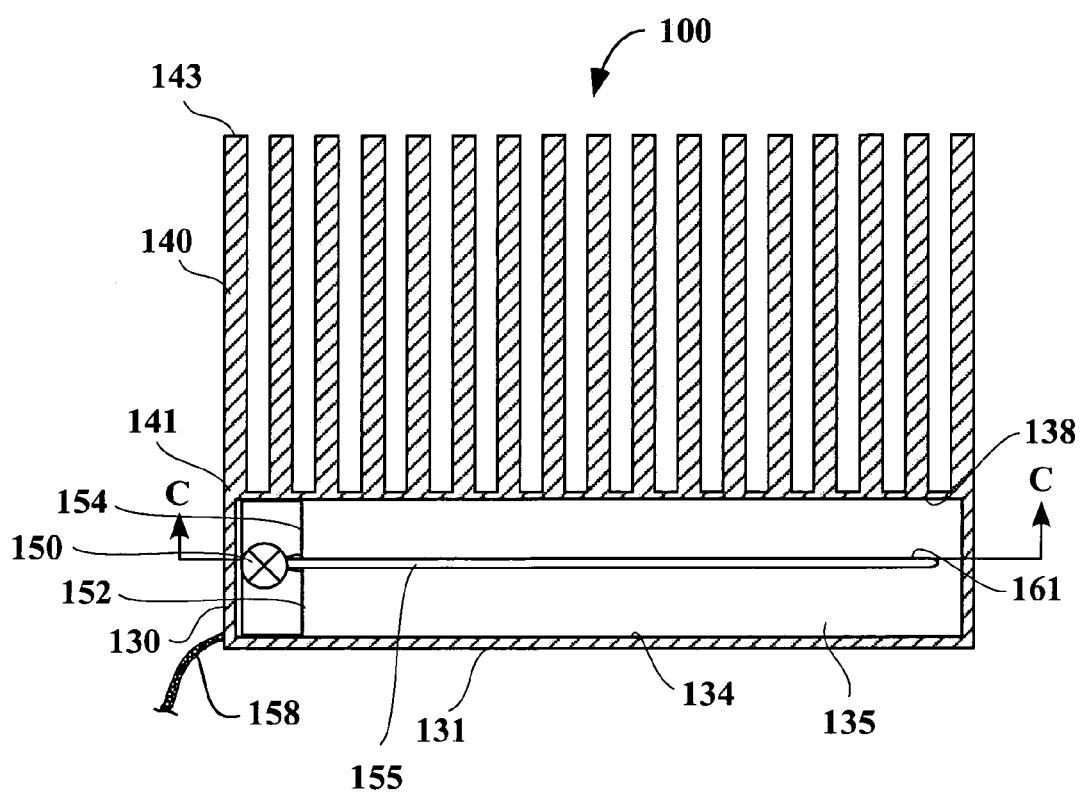
FIG. 3 is a cross-sectional view of the heatsink of the present invention taken about line A—A of FIG. 1.

Referring now to FIG. 3, there is shown a cross-sectional view of heatsink 100. As shown in FIG. 3, base 130 further includes chamber 135 defined by a first surface 134 and a second surface 138. Chamber 135 is further defined by divider 155 disposed between first surface 134 and second surface 138 of chamber 135. Chamber 135 further includes pump 150, pump inlet 152 and pump outlet 154, cooling fluid 170, flow divider 160a through 160g, and fluid return apertures 165. In use, distal end 131 of base 130 of heatsink 100 is in contact with heat source H. As heat source H generates heat, heat is transferred through distal surface 131 to first surface 134 of heatsink 100 by conduction, heat within first surface 134 is transferred through convection to cooling fluid 170 that is in contact with first surface 134. Pump 150 is located at the edge of chamber 135 in base 130 and receives the cooling fluid. Cooling fluid 170 then enters pump intake 152 where pump 150 then pumps the cooling fluid 170 from first surface 134 of chamber 135 to first surface 161 of divider 155. As the cooling fluid 170 moves over the first surface 161 of divider 155 heat is transferred from the cooling fluid 170 to second surface 138 of chamber 135 and to fins 140. Cooling fluid 170 then is drawn through fluid return apertures 165 and back to first surface 134 of chamber 135 to repeat the process above. The process above is carried out so long as pump 150 is energized. In one embodiment, pump 150 is energized from a power source coupled to the heat source, thus when the heat source is receiving power, pump 150 also receives power. Alternatively, pump 150 may be coupled to a temperature-sensing device, so that pump 150 is energized above a threshold temperature until a second lower temperature is reached.

As an example (not shown) a temperature probe may be mounted on a CPU in a computer, when the temperature reaches T° the pump is energized, thereby causing the fluid within heatsink 100 to be circulated within chamber 135, thereby removing heat from the CPU, when a lower temperature is obtained the temperature probe then disconnects power to pump 150 and fluid circulation within chamber 135 ceases. This process would be repeated so long as the temperature probe is receiving a signal.

Figure 4:
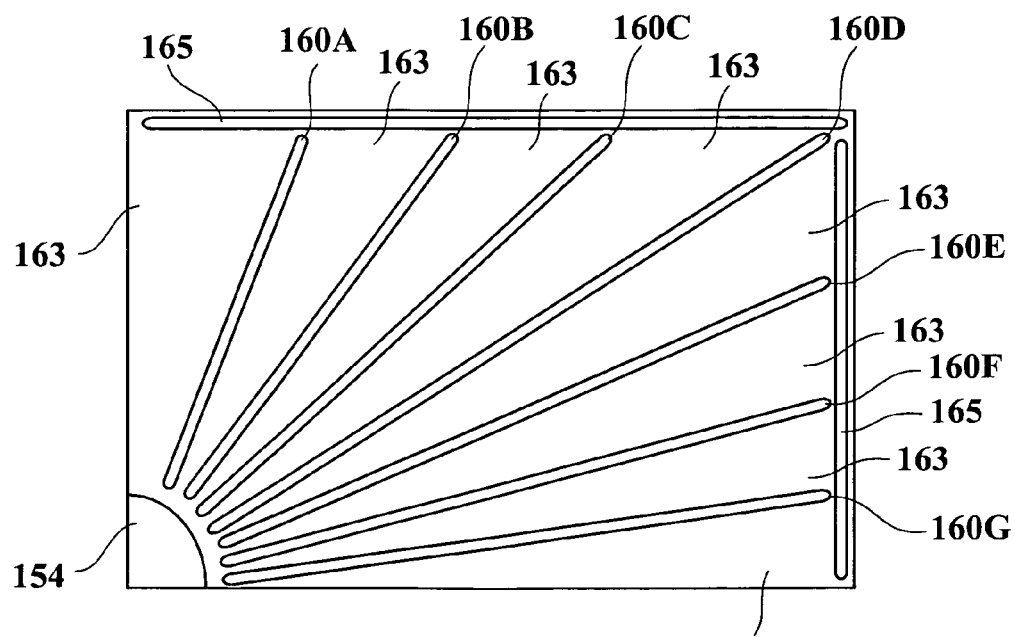
FIG. 4 is a cross-sectional view of the heatsink of the present invention taken about line C—C of FIG. 3.

Referring now to FIG. 4, there is shown a cross-sectional view of heatsink 100 about line C—C of FIG. 3. As shown in FIG. 4 flow dividers 160a through 160g are disposed upon proximal surface 161 of divider 155 within chamber 135 of base 130. Flow dividers 160a through 160g are designed to maximize fluid flow over divider 155 thereby increasing the efficiency of heat transfer from cooling fluid 170 to second surface 138 of chamber 135 of base 130 and to fins 140. Therefore, when designing flow dividers 160a through 160g, the spacing 163 between the flow dividers 160 may be increased or decreased to increase or decrease fluid flow between the flow dividers 160.

As shown in FIG. 4, fluid return apertures 165 are disposed about the periphery of chamber 135 and opposite pump outlet 154. In use, cooling fluid 170 exits pump outlet 154 and flows across divider 155 through flow dividers 160a through 160g, then through apertures 165, back to first surface 134 of chamber 135 where the now cooled fluid can absorb more heat from the heat source. In one embodiment as shown in FIG. 4, flow dividers 160a through 160g radiate outward from pump outlet 154. The embodiment shown in FIG. 4 should not be considered limiting in any manner and is merely shown for illustrative purposes, the flow dividers 160a through 160g may be designed having many different geometries. For example, flow dividers placed near the edges of divider 155 may have larger passages to allow more fluid to flow therethrough, while flow dividers disposed at or near the center of divider 155 may be narrower to reduce the fluid flow therethrough.

As shown in FIGS. 3 and 4, pump 150 is disposed within chamber 135 of base 130. Thus, the heatsink 100 is a completely sealed unit having only power cord 158 extending from base 130. Therefore the danger of having any external fluid couplings coming loose is eliminated. Still further, the unitary design simplifies the use of the heatsink, not unlike conventional heatsinks, all that would be required to utilized the heatsink of the present invention is to affix the heatsink to a heat source (typically a computer CPU) using known methods and plugging the power cord into an available power source within the computer case (such as a power supply connector for a floppy drive or hard drive) or simply plugging the cord into a dedicated connector located on the mother board. Therefore with the present invention there is no need to have an external unit coupled to the computer, nor is there any plumbing requirements.

Figure 5:
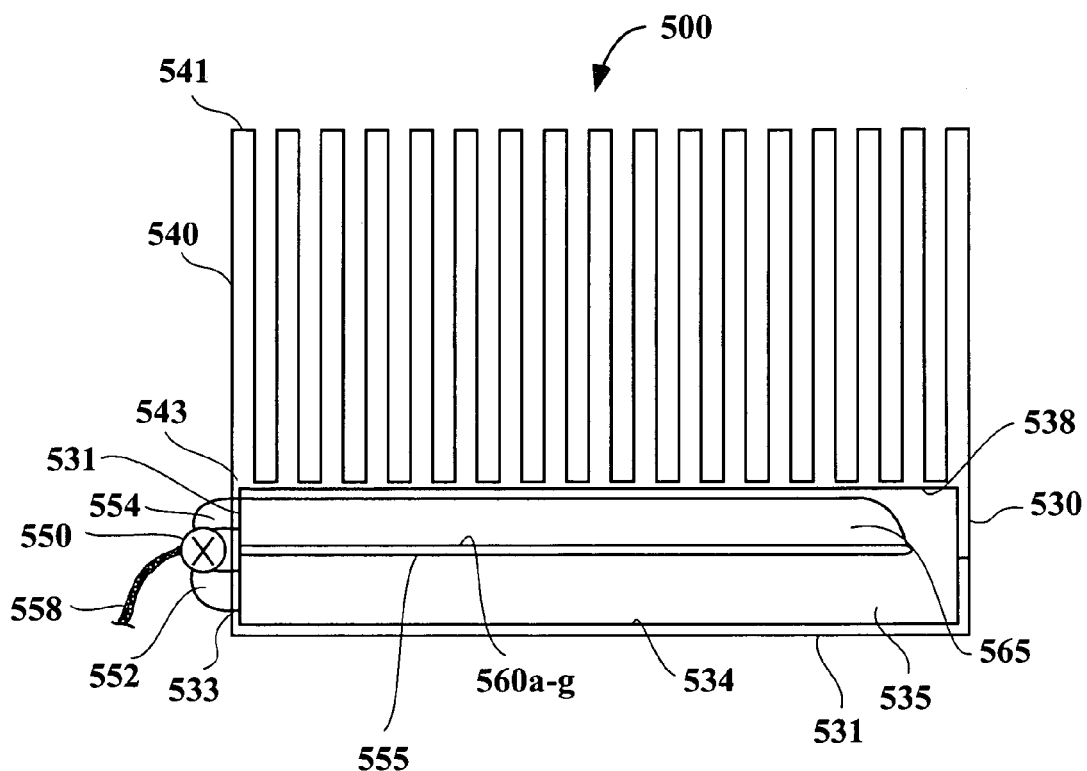
FIG. 5 is a side view of a first alternative embodiment of the present invention.

Referring now to FIG. 5 there is shown an alternative embodiment of the present invention. As shown in FIG. 5, heatsink 500 comprises, base 530 and fins 540. Base 530 comprises chamber 535 having first surface 534 and second surface 538 and a divider 555 disposed adjacent to the first surface 534. Chamber 530 further includes at least one flow divider 565 disposed upon the first surface of divider 555. Chamber 530 further includes a fluid outlet 531 and fluid inlet 533 and cooling fluid 570.

As shown in FIG. 5, heatsink 500 pump 550 disposed adjacent to an edge of base 530. Pump intake 554 is coupled to and in fluid communication with fluid outlet 531 and pump intake 552 is coupled to and in fluid communication with fluid inlet 533. The embodiment as shown in FIG. 5 allows pump 550 to be replaced in the event of pump failure.

In use Heatsink 500 is detachably attached to a heat source, such as a computer CPU, using methods known in the art. Power cord 558 is connected to an appropriate power source within the computer case. Such an appropriate connector would be a spare power cord from the computers power supply or a dedicated connector on the computer's motherboard.

Figure 6:
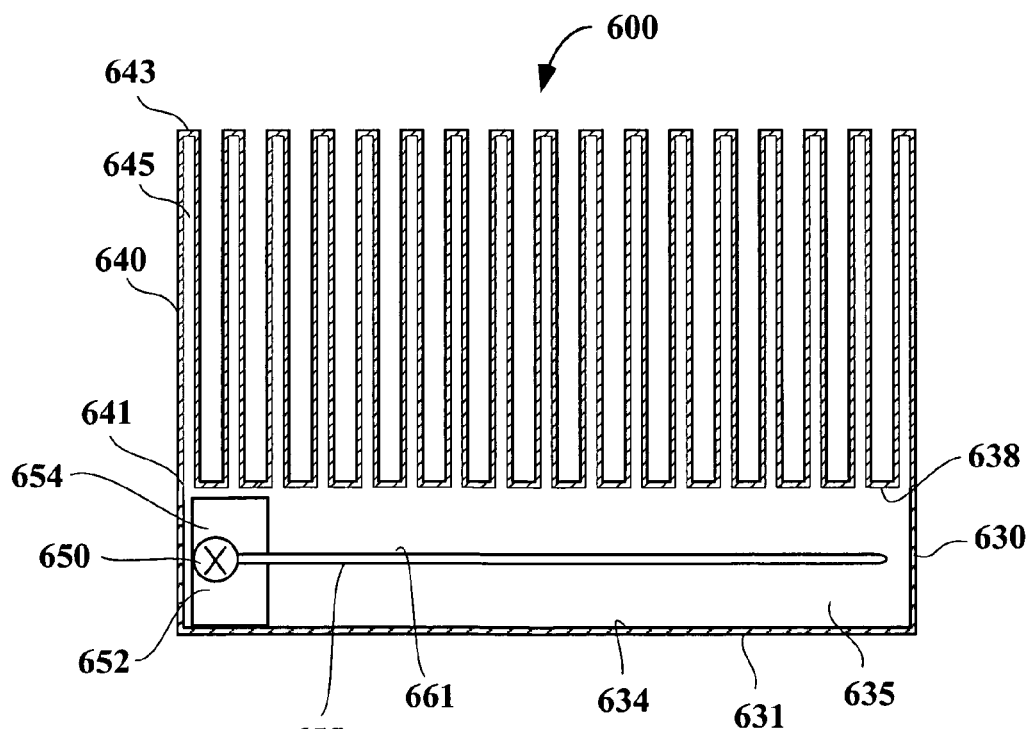
FIG. 6 is a cross-sectional view of the first alternative embodiment of the present invention.

Referring now to FIG. 6 there is shown a second alternative embodiment of the present invention. As illustrated in FIG. 6 heatsink 600 comprises a base 630 and fins 640. Base 630 further includes a chamber defined by a first surface 634 and second surface 638. Chamber 635 further includes divider 655 and pump 650 disposed therein. Divider 655 being disposed adjacent to the first surface 631 of base 630. Pump 650 being disposed adjacent to an edge of base 630.

Fins 640 include first end 641 and second end 643 and bore 645 disposed therebetween. First ends 641 of fins 641 are disposed adjacent to second surface 138 of base 630 and extend away from base 630. Bore 645 is in fluid communication with chamber 635 and cooing fluid 670 within chamber 635.

In use, heatsink 600 is disposed adjacent to a heat source H (not shown). As heat is generated by heat source H, heat is transferred to first surface 634 of base 630 by convection. Heat is then transferred to cooling fluid 670 flowing over first surface 634 of base 630. Cooling fluid 670 being pumped over first surface 634 of base 631 by pump 650. Pump 650 then discharges cooling fluid 670 thorough pump outlet 654. Pump outlet 654 is configured to be in communication with first surface 661 of divider 655. Divider 655 may further include flow dividers 665 (not shown) disposed upon first surface 661 and extending therefrom. Flow dividers 665 may be arranged to maximize fluid flow over first surface 661 flow divider 655. In the present embodiment, cooling fluid 670 may also flow into bores 645 of fins 640 thereby maximizing heat transfer between the heat source cooling fluid 670, and fins 640.

Figure 7:
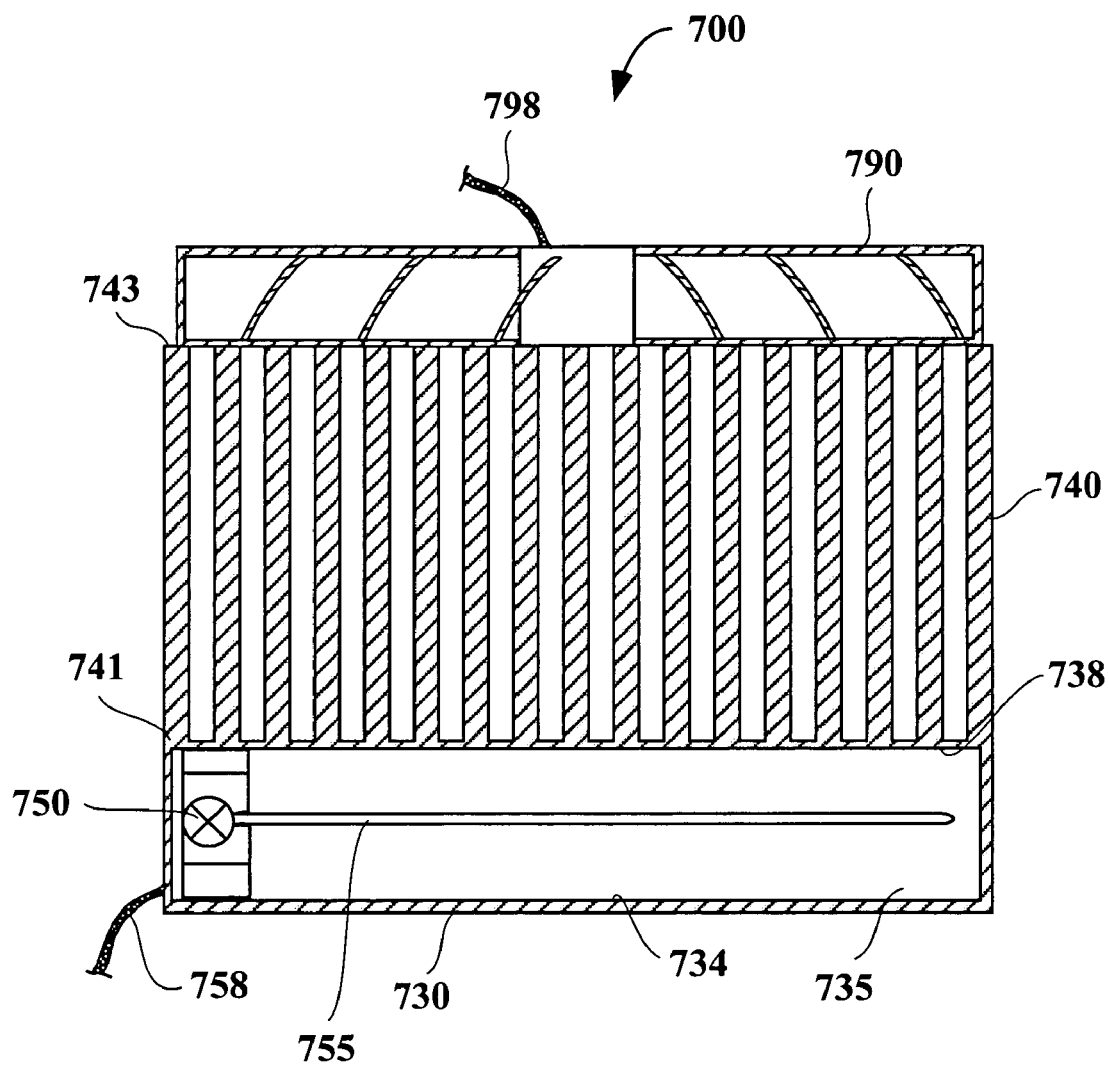
FIG. 7 is a cross-sectional view of a second alternative embodiment of the present invention.

Referring now to FIG. 7, there is shown a third alternative embodiment of the present invention. Heatsink 700 as shown in FIG. 7 comprises a base 730, a plurality of fins 740 and a fan 790. Base 730 further includes a chamber 735 defined by a first surface 734 and a second surface 738. Chamber 735 further includes divider 755, cooling fluid 770 and pump 750 disposed therein Divider 755 is disposed adjacent to first surface 734 of chamber 735. Pump 750 being disposed adjacent to an edge of chamber 735.

Fins 740 further include first end 741 and second end 743 extend from the second surface 738 of base 730. The spacing and height of fins 740 are dependent upon the application of the heat sink. Fan 790 further includes power cord 798 extending therefrom. Fan 790 is disposed adjacent to the second end 743 of fins 740. Fan 790 is fixedly attached to the fins 740 either through the use of a mechanical fastener such as a screw or bolt or alternatively, fan 790 may be fixedly attached to fins 740 with adhesive, such as epoxy or hot glue.

Fan 790 may be wired in parallel with pump 750, thus when pump 750 is energized fan 790 is also energized. Alternatively, Fan 790 may be coupled to a separate power source and temperature sensor for independent operation.

In each of the embodiments discussed above, the heat transfer efficiency has been maximized. Unlike conventional heatsinks that may not have heat transfer over one hundred percent of their base surface area the present invention eliminates cold spots within the heatsink, thereby maximizing the heat transfer ability of the heatsink. In any of the above examples and within the claims the cooling fluid to be used within the chamber of the heat sink may be any one of the following fluids, water, alcohol, propylene glycol, antifreeze, or similar fluids having good heat transfer capabilities.

All of the examples given above and shown in the drawings are for exemplary purposes only and should not be considered limiting in any manner. The heatsink of the present invention may be affixed to a heat source using conventional methods known in the art. For example, the heatsink may include a removable clip that is detachably attached to the CPU carrier, or the heatsink may be affixed using screws that pass through the heatsink and into a CPU carrier or into the motherboard.

What is claimed is:

1. A device for the transfer of heat away from a heat source comprising:
   a base having first and second surfaces, said first surface being configured to be attached to a surface of said heat source;
   a plurality of fins extending from said second surface of said base, said plurality of fins being integrated with said second surface;
   a chamber disposed between said first surface and said second surface of said base;
   a divider disposed between said first surface and said second surface within said chamber;
   a cooling fluid disposed within said chamber;
   a pump proximate an edge of said base, said pump having a power cord connected to a power source, said pump being configured to circulate said cooling fluid within said chamber;
   an inlet of said pump being proximate said first surface of said base to receive said cooling fluid in said chamber that is proximate said first surface;
   an outlet of said pump that pumps said cooling fluid over a first surface of said divider; and a plurality of flow dividers disposed upon a proximal surface of said divider, said plurality of flow dividers radiating outward from said outlet of said pump and passages between said flow dividers that carry fluid being narrower at said outlet of said pump.

2. The device according to claim 1 characterized in that said pump is disposed within said chamber.

3. The device according to claim 1 wherein said cooling fluid is chosen from the group consisting of alcohol, antifreeze, propylene glycol, water.

4. The device according to claim 1 wherein said base and said fins are constructed of one of the following materials chosen from the group consisting of copper, aluminum, steel, plastic.

5. The device according to claim 1 further including a fan attached to said fins.

6. A device for transferring heat away from a heat source, comprising:

a base having first and second surfaces, the first surface being configured to be attached to a surface of the heat source;

at least one fin extending from the second surface, the at least one fin being integrated with the second surface;

a chamber disposed between the first and second surfaces of the base;

a divider disposed between the first and second surfaces within the chamber;

a pump proximate to an edge of the base, the pump being configured to circulate a cooling fluid within the chamber; and a plurality of flow dividers disposed upon a proximal surface of the divider, the plurality of flow dividers radiating outward from an outlet of the pump and passages between the flow dividers being narrower at the outlet of the pump relative to the edge of the base.

7. The device of claim 6, further comprising:

an inlet of the pump proximate to the first surface, the inlet being configured to receive the cooling fluid within the chamber; and the outlet of the pump proximate to the second surface, the outlet being configured to pump the cooling fluid over the second surface.

8. The device of claim 6, wherein the cooling fluid is contained within the chamber.

9. The device of claim 6, further comprising:

a fan attached to the at least one fin.

* * * * *